United States Patent
Suzuki et al.

[11] Patent Number: 6,025,593
[45] Date of Patent: Feb. 15, 2000

[54] SCANNING ELECTRON MICROSCOPE

[75] Inventors: Naomasa Suzuki; Mitsugu Sato, both of Hitachinaka, Japan

[73] Assignee: Hitachi, Ltd., Tokyo, Japan

[21] Appl. No.: 09/065,871

[22] Filed: Apr. 24, 1998

[30] Foreign Application Priority Data

Apr. 25, 1997 [JP] Japan ................................. 9-123096

[51] Int. Cl.[7] .......................... H01J 37/28; H01J 37/244
[52] U.S. Cl. ........................................... 250/310; 250/311
[58] Field of Search ..................................... 250/310, 311

[56] References Cited

U.S. PATENT DOCUMENTS

| | | | |
|---|---|---|---|
| 4,300,045 | 11/1981 | Ibach et al. ............................. | 250/305 |
| 4,658,136 | 4/1987 | Ohtaka et al. . | |
| 4,893,009 | 1/1990 | Kuroda . | |
| 5,387,793 | 2/1995 | Sato et al. ............................... | 250/310 |
| 5,594,245 | 1/1997 | Todokoro et al. ...................... | 250/310 |
| 5,872,358 | 2/1999 | Todokoro et al. ...................... | 250/310 |

FOREIGN PATENT DOCUMENTS

| | | | |
|---|---|---|---|
| 0561584 | 9/1993 | European Pat. Off. ............... | 250/310 |
| 0592899 | 4/1994 | European Pat. Off. ............... | 250/310 |
| 0661727 | 7/1995 | European Pat. Off. . | |
| 0732726 | 9/1996 | European Pat. Off. ............... | 250/310 |
| 0769799 | 4/1997 | European Pat. Off. ............... | 250/310 |
| 0780878 | 6/1997 | European Pat. Off. . | |
| 19549022 | 7/1996 | Germany ............................... | 250/310 |
| 7-192679 | 7/1995 | Japan . | |

*Primary Examiner*—Edward P. Westin
*Assistant Examiner*—Nikita Wells
*Attorney, Agent, or Firm*—Kenyon & Kenyon

[57] ABSTRACT

A scanning electron microscope is provided which can achieve an improved detection efficiency in the detection of secondary electrons without affecting an electron beam for irradiating a specimen, and which is suitable for detecting specific secondary electrons in a specific energy range. Secondary electrons 14 generated by irradiation of specimen 8 with electron beam 4 are decelerated by a decelerating electrical field formed by a pair of electrodes 10, 11 of field generation unit 28. Thereby, a portion of secondary electrons having a low energy is repelled. Other secondary electrons not having been repelled are deflected by a deflecting electrical field formed between the pair of electrodes as well as by a deflecting magnetic field which is orthogonal to the deflecting electrical field, to be detected by secondary electron detector 12. However, a portion of secondary electrons having a higher energy which could not have been deflected by the deflecting electrical field and deflecting magnetic field cannot be detected by secondary electron detector 12.

10 Claims, 5 Drawing Sheets

(A)

(B)

SCANNING ELECTRON MICROSCOPE

BACKGROUND OF THE INVENTION

The present invention relates to a scanning electron microscope which irradiates a specimen with an electron beam and detects secondary electrons generated by irradiation of the specimen, and in particular, it relates to a scanning electron microscope which can detect secondary electrons in a designated energy region of the secondary electrons from the specimen.

The scanning electron microscope is generally comprised of the steps: irradiating a sample with an electron beam, detecting secondary electrons having been generated by irradiation of the sample using a secondary electron detector, and producing an image of the sample on the basis of a detection signal output therefrom.

The secondary electrons obtainable from the sample have a relatively broad energy region. Normally, all of these secondary electrons in the relatively broad energy region are output without selection of energy.

SUMMARY OF THE INVENTION

A sample surface information (mainly surface irregularity information) contained in a secondary electron signal generated in the sample differs in its energy components depending on samples. Normally, most of sample surface information which characterizes its sample is contained in a narrow energy region, and other components in other energy regions contain information on noise, charge or the like. In such a case, if any sample image is produced entirely on the basis of detected signals of secondary electrons as generated without processing to select its energy region, its sample image produced has a worse S/N ratio including noise and charge information.

JP-A 7-192679 discloses a scanning electron microscope which is provided with additional electrode placed in the bottom portion of its electron deflection electrodes for applying a negative voltage in order to selectively detect high energy electrons and low energy electrons. However, it is not adequate to be able to selectively detect a particular surface information.

The object of the invention is to provide a scanning electron microscope which is capable of improving the efficiency of detection of secondary electrons without affecting an electron beam which irradiates a sample specimen, and which is suitable for detecting secondary electrons in a specified energy region.

The scanning electron microscope of the invention is characterized by comprising: an electron gun for producing an electron beam; a beam irradiation system for irradiating the specimen with the electron beam so as to cause the specimen to emit secondary electrons; a secondary electron detector placed apart from an axis of the electron beam for detecting the secondary electrons; and a field generation unit which generates an electrical field for deflecting and directing the secondary electrons to the secondary electron detector, an electrical field for decelerating or accelerating the secondary electrons, and a magnetic field which deflects the secondary electrons such as to cancel the deflection of the secondary electrons due to the deflecting electrical field, the magnetic field being substantially orthogonal to the deflecting electrical field.

BRIEF DESCRIPTION OF THE DRAWINGS

The above and other features of the invention will be apparent from the following description taken in connecting with the accompanying drawings, in which.

DETAILED DESCRIPTION OF THE PREFERRED EMBODIMENTS

Figure 1:
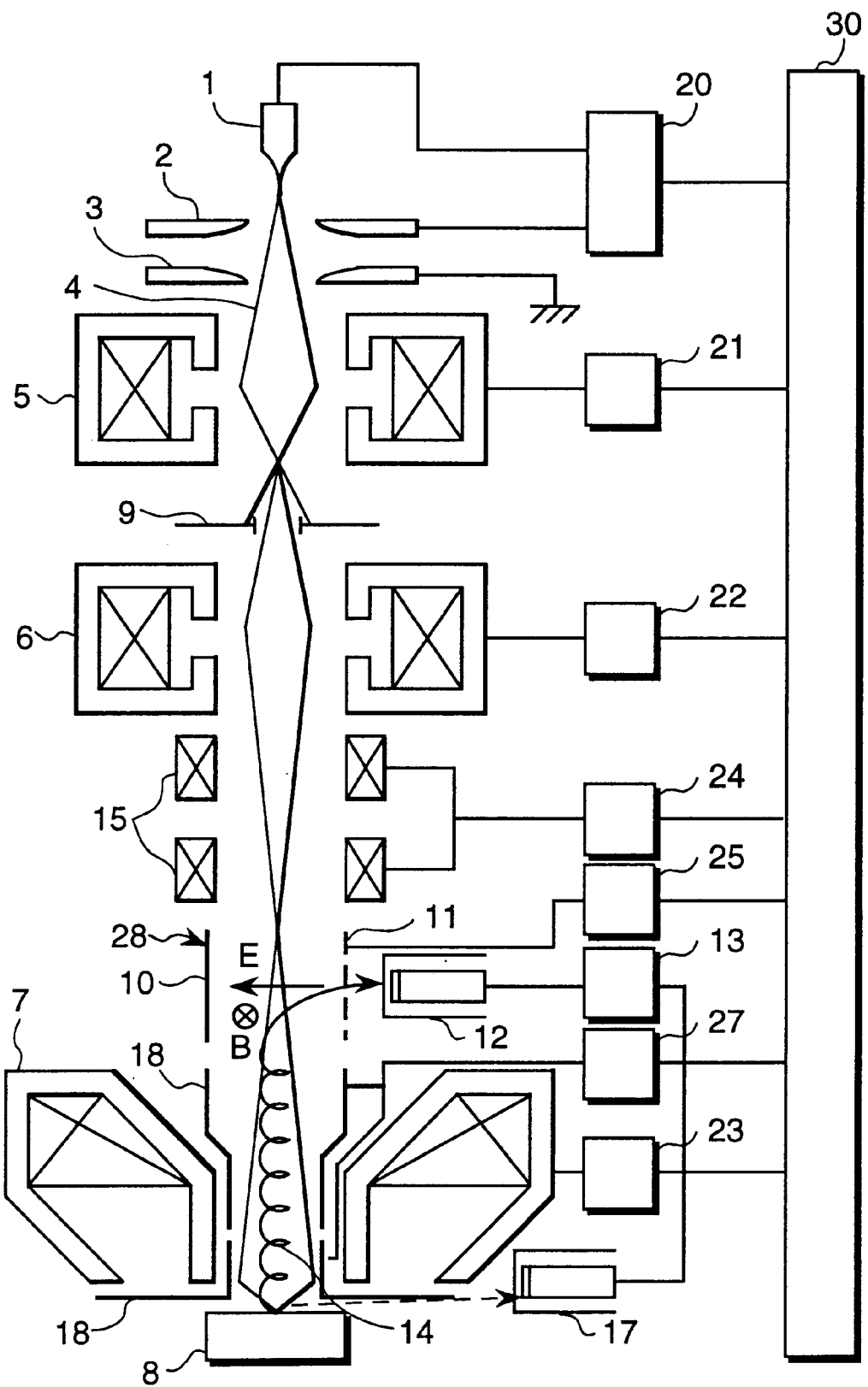
FIG. 1 is a schematic cross-sectional view of a scanning electron microscope according to one embodiment the invention.

With reference to FIG. 1, an embodiment of the invention is indicated. A high voltage is applied across a cathode 1 and a first anode 2 from a high voltage control power source 20 which is controlled by a micro processor (CPU) 30 so as to extract an electron beam 4 of a predetermined emission current from cathode 1. An accelerating voltage is applied across cathode 1 and a second anode 3 from high voltage control power source 20 which is controlled by CPU 30, thereby accelerating electron beam 4 emitted from cathode 1 to advance to an irradiation lens system in a subsequent stage.

Electron beam 4 is converged by a condenser lens 5 provided for beam current regulation which is controlled by lens control power source 21, and an unnecessary region of electron beam 4 is removed by a diaphragm 9. Then, the electron beam is focused by a condenser lens 6 for reduction ratio adjustment which is controlled by lens control power source 22 and by an object lens 7 which is controlled by object lens control power source 23 into a small spot of beam on a specimen 8. Then, by applying a scanning signal to scanning coil 15, specimen 8 is scanned two-dimensionally with a focused electron beam 4. The scanning signal to be applied to the scanning coil 15 is controlled according to a multiplication ratio of observation by scanning coil control power source 24. A beam spread angle of electron beam 4 is determined at an optimum value by an aperture diameter of diaphragm 9 and a focus position of condenser lens 6 for reduction ratio adjustment.

Figure 2:
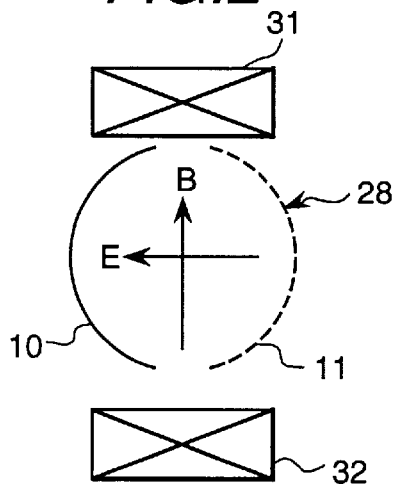
FIG. 2 is a schematic plan view of a field generation unit of FIG. 1.

On the side of object lens 7 viewed from scanning coil 15, there is provided a field generation unit 28. This field generation unit 28 which is normally referred to simply as E×B (E cross B) is comprised of: a pair of electrodes 10 and 11 which produces a deflection electrical field (E) for deflecting secondary electrons 14 having been generated by irradiation of specimen 8 and passed through object lens 7 toward the secondary electron detector 12, and which pair of electrodes also produce decelerating or accelerating electrical fields for decelerating or accelerating the secondary electrons in the axial directions of the electron beam 4; and a pair of electromagnetic coils 31 and 32 which generate a deflection magnetic field (B) for deflecting the secondary electrons having passed through object lens 7 toward the secondary electron detector 12, as indicated in FIG. 2. Deflection electrical field (E) and deflection magnetic field (B) are formed orthogonal to each other, and an intensity of deflection electrical field (E) is set at a value which cancels the deflection of electron beam 14 due to deflection magnetic field (B). A voltage to be applied across the pair of electrodes 10 and 11 for forming deflection electrical field (E) and the decelerating or accelerating electrical filed, respectively is supplied appropriately from field unit control power source 25 which is controlled by CPU 30. Respective voltages are variable so as to be able to change deflection electrical field (E) and the decelerating or accelerating electrical field. Deflection magnetic field (B) is also ensured to be variable.

Electrode 11 of the pair of electrodes 10 and 11 which is placed on the side of secondary electron detector 12 is comprised of a metal plate screen, thereby allowing secondary electrons 14 to pass through electrode 11 to be detected by secondary electron detector 12. An output signal (image signal) from secondary electron detector 12 is displayed on an image display device 13 as a sample image of sample 8.

When voltages of −VE−VF2 and +VE−VF2 are applied to the pair of electrodes 10 and 11, respectively, a deflection electrical field is formed between the pair of electrodes 10 and 11 for deflecting secondary electrons 14 having been generated. Further, since a potential between the pair of electrodes 10 and 11 and on the axis of electron beam 4 is −VF2, a deceleration electrical field is formed for decelerating secondary electrons 14 in the direction of its axis. Therefore, secondary electrons 14 having been produced in sample 8 and passed through object lens 7 are decelerated by VF2 due to the deceleration electrical field, thus, a portion of secondary electrons 14 having energy lower than VF2 is repelled thereby unable to be detected by secondary electron detector 12.

Figure 3:
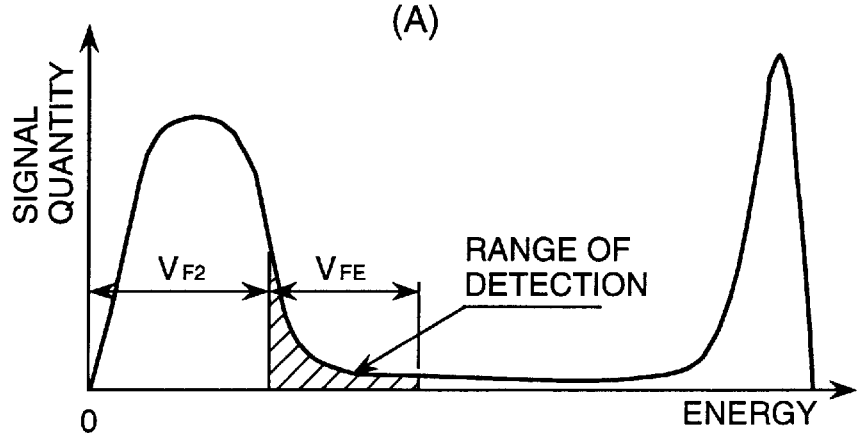
FIGS. 3(A) and (B) are graphs indicative of energy regions of secondary electrons having been detected according to the embodiment of the invention of FIG. 1.
Figure 3:
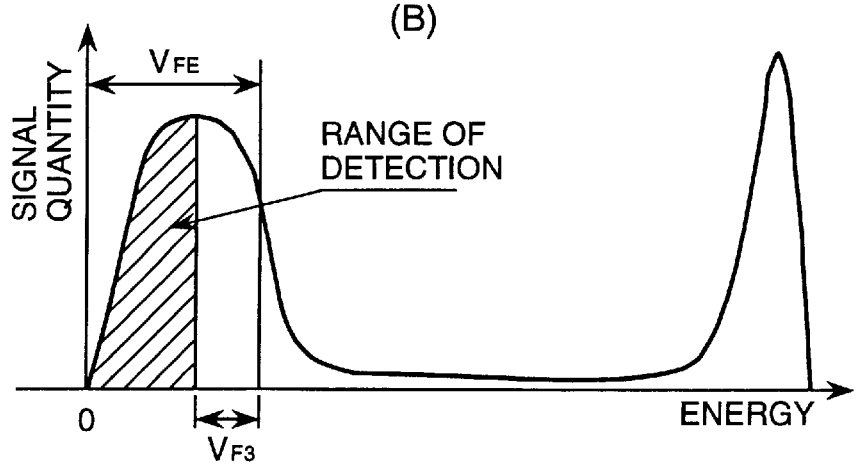

Secondary electrons which have not been repelled by the deceleration electrical field are caused to be deflected by the deflecting electrical field and the deflecting magnetic field to be detected by secondary electron detector 12. However, secondary electrons having a high energy are not deflected substantially or if deflected, its quantity of deflection is very small, thus, the high energy secondary electrons are not detected by secondary electron detector 12. Thereby, a range of energy for the secondary electrons which can be detected by secondary electron detector 12 will be such as indicated in FIG. 3(A). This figure indicates that the secondary electrons in a shaded area are detected by secondary electron detector 12. VFE in this figure depicts a range of energy of the secondary electrons which can be deflected by field generation unit 28. A width and position of the energy range of detectable secondary electrons can be changed by changing a value or values of VE and/or VF2, that is, by changing voltages for forming the deflecting electrical field and/or the decelerating electrical field.

Intensities of the deflecting electrical field and deflecting magnetic field are set at values whereby deflections of electron beam 4 by these two fields can be canceled. Thereby, electron beam 4 is not affected by the deflection. Further, since the secondary electrons are deflected to advance to secondary electron detector 12 by the deflecting electrical field and the deflecting magnetic field, efficiency of detection of secondary electrons 14 having been generated is improved substantially. Thereby, according to the embodiment of the invention described above, there are such advantages that an improved efficiency of detection of the secondary electrons can be expected, and that particular secondary electrons in a specified energy range can be detected without affecting the electron beam for irradiating the specimen.

As described above, the intensities of the deflecting electrical field and deflecting magnetic field are set at values such that the deflection effects on electron beam 4 by these two fields are canceled. Namely, assuming $I_R$ as a current to produce a deflecting magnetic field, there holds a relation with VE as follows.

$$IB/\sqrt{Vacc} = A \cdot VE/Vacc,$$

where A is a constant which is determined by the number of turns of a deflecting magnetic field coil.

In FIG. 1, instead of voltages of −VE−VF2 and +VE−VF2 which were applied across the pair of electrodes 10 and 11, voltages of −VE+VF3 and +VE+VF3 may be applied therebetween. In this case, since a potential between the pair of electrodes 10 and 11, and on the axis of its electron beam becomes +VF3, an accelerating electrical field is formed instead of the decelerating electrical field described above. Thereby, secondary electrons 14 having been generated are accelerated by VF3 due to the accelerating electrical field. The secondary electrons having been accelerated are deflected by the deflecting electrical field and the deflecting magnetic field to be detected by secondary electron detector 12. In this instance, a portion of secondary electrons on the side of high energy range which would have been detected by secondary electron detector 12 unless it had not been accelerated becomes undetectable by secondary electron detector 12. As a consequence, an energy range of secondary electrons detectable by secondary electron detector 12 becomes as indicated in FIG. 3(B). Thereby, it should be noted that a predetermined object of the invention can be realized in the same manner as in the case described above through use of the accelerating electrical field instead of the decelerating electrical field.

In FIG. 1, numeral 18 depicts attraction electrode which is applied with a secondary electron attraction voltage from attraction electrode power source 27 which is controlled by CPU 30. Secondary electrons 14 generated in sample 8 are attracted by attraction electrode 18 and are directed to field generation unit 28 without divergence. Thereby, further improvement in efficiency of detection of secondary electrons can be realized.

Further, in FIG. 1, another secondary electron detector 17 is installed between object lens 7 and sample 8. The secondary electrons having been generated in the sample are also detected by the secondary electron detector 17. Then, detection outputs from both the secondary electron detectors 17 and 12 are synthesized into an image having a greater signal quantity and displayed on image display device 13.

Figure 4:
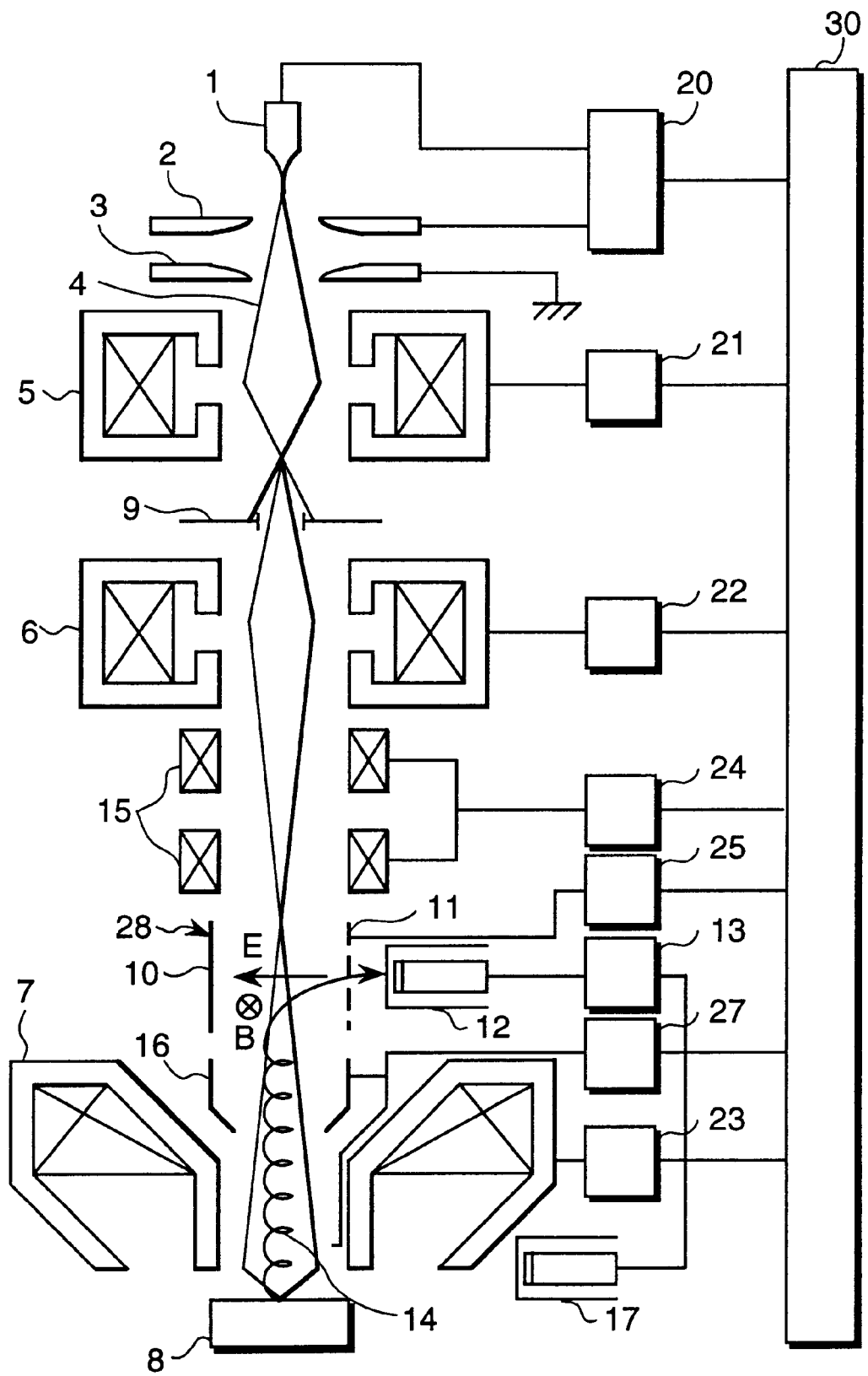
FIG. 4 is a schematic cross-sectional view of another scanning electron microscope according to another embodiment of the invention.

With reference to FIG. 4, another embodiment of the invention will be described. This another embodiment of the invention differs from the aforementioned embodiment of FIG. 1 in that its field generation unit 28 includes another electrode (filter electrode) 16 which is placed between a pair of electrodes 10, 11 and object lens 7. This another electrode 16 is applied with a decelerating voltage which is variable from electrode control power source 26 which is controlled by CPU 30, thereby forming a decelerating electrical field for decelerating the secondary electrons in the axial direction of the electron beam. Assuming this decelerating voltage for forming the decelerating electrical field to be −VF1, then, the secondary electrons 14 having been generated will be decelerated by VF1 due to the decelerating electrical field. Thereby, a portion of the secondary electrons having energy smaller than VF1 will be repelled.

Figure 5:
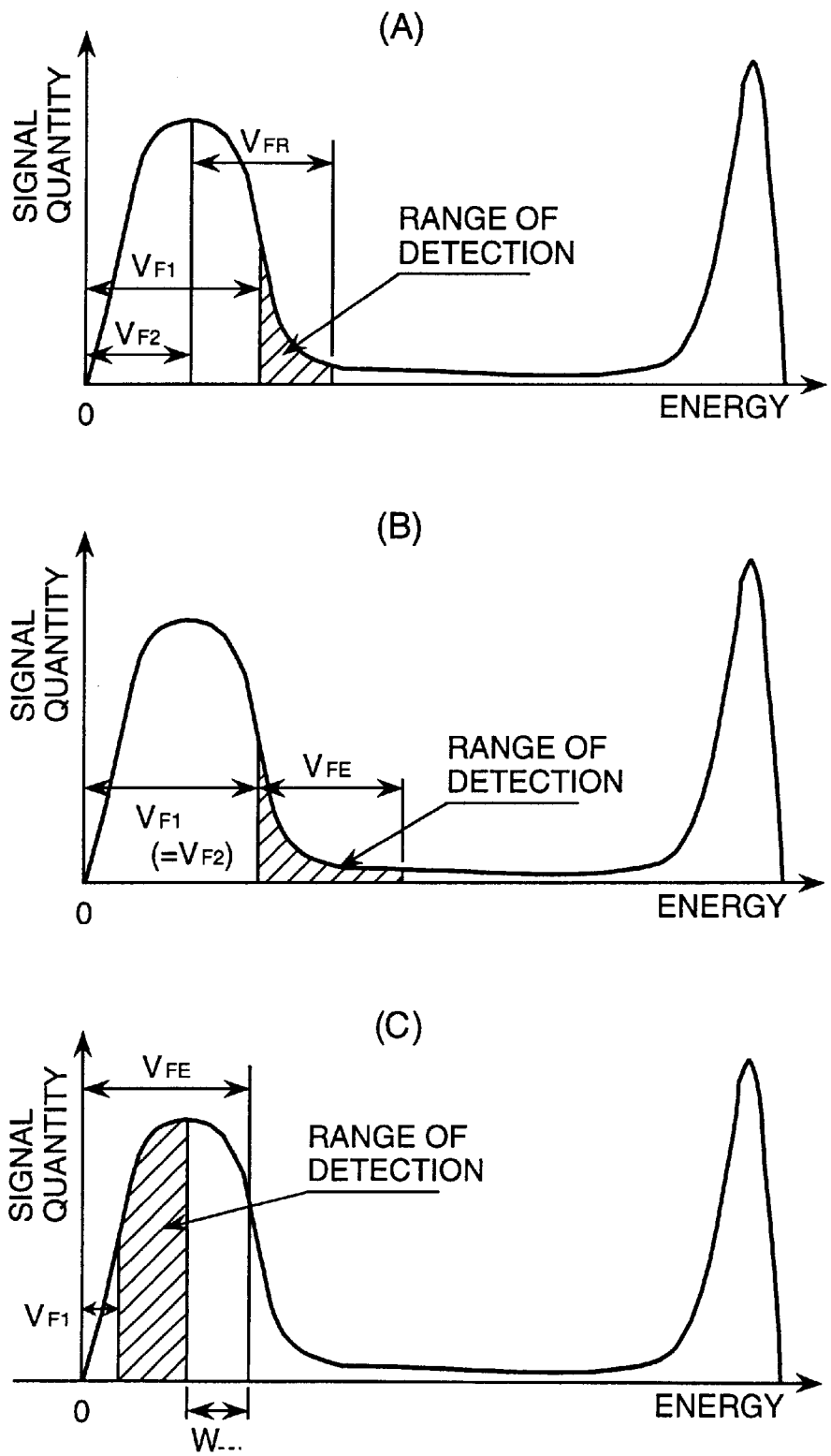
FIGS. 5(A)–(C) are graphs indicative of energy regions of secondary electrons having been detected by the another embodiment of FIG. 4.

Further, across the pair of electrodes 10 and 11, voltages of −VE−VF2 and +VE−VF2 are applied, respectively. Thereby, since a voltage between the pair of electrodes 10 and 11 and on the axis of the electron beam is −VF2, a decelerating electrical field which decelerates the secondary electrons in the axial direction of the electron beam is formed. Thereby, since the secondary electrons having passed through electrode 16 are decelerated by VF2, a portion of the secondary electrons having energy lower than VF2 is expelled. The rest of the secondary electrons not having been expelled is deflected by the deflecting electrical field and the deflecting magnetic field which are formed between the pair of electrodes 10 and 11, and is detected by secondary electron detector 12. However, it should be noted that a portion of the secondary electrons on the side of the high energy region and which has not been deflected by the deflecting electrical field and the deflecting magnetic field fails to be detected by the secondary electron detector 12. In this case, an energy range that can be detected by secondary electron detector 12 becomes as indicated in FIG. 5(A). As a matter of course, by changing values of VF1, VE or VF2, a width and a position of energy of secondary electrons to be detected can be varied. Therefore, it should be understood that a predetermined object of the invention can be achieved in the same manner as in the embodiment of FIG. 1.

When VF2 is set at VF1, i.e., VF2=VF1, an energy range of secondary electrons that can be detected by secondary electron detector 12 is indicated in FIG. 5(B). It is noted that a width and position of its energy range are changed.

There may be applied voltages of −VE+VF3 and +VE+VF3, respectively across the pair of electrodes 10 and 11. In this case, a potential between the pair of electrodes 10 and 11 and on the axis of electron beam 14 becomes +VF3, thereby forming an accelerating electrical field, thereby accelerating the secondary electrons having passed through electrode 16 by its accelerating electrical field. An energy range of secondary electrons to be detected by secondary electron detector 12 in this case becomes as indicated in FIG. 5(C). By changing values of VE, VF1 or VF3, a width and position of energy of secondary electrons to be detected by secondary electron detector 12 can be modified.

In the embodiment of FIG. 4, the voltage to be applied to electrode 16 may be set at 0, or at a positive value whereby forming an accelerating electrical field so as to accelerate the whole secondary electrons having been generated toward the pair of electrodes 10, 11. Further, it may be arranged such that while not changing the voltage of −VF1 applied to electrode 16, the voltage of VF2 to be applied to the pair of electrodes 10, 11 may be changed to 0.

Some of the secondary electrons which have escaped the deflection effect by the deflecting fields irradiate a surface portion of field generation unit 28. As a consequence, there occurs a problem that secondary particles or radiations such as X-rays or the like are emitted from that portion. In order to solve such a problem, it is preferable to form the portion of the surface subject to such irradiation with a material which does not easily emit secondary particles or radiations, using, for example, light metals and the like.

Figure 6:
FIGS. 6(A) and (B) are SEM photographs taken using the embodiment of the invention and using the prior art.
Figure 6:
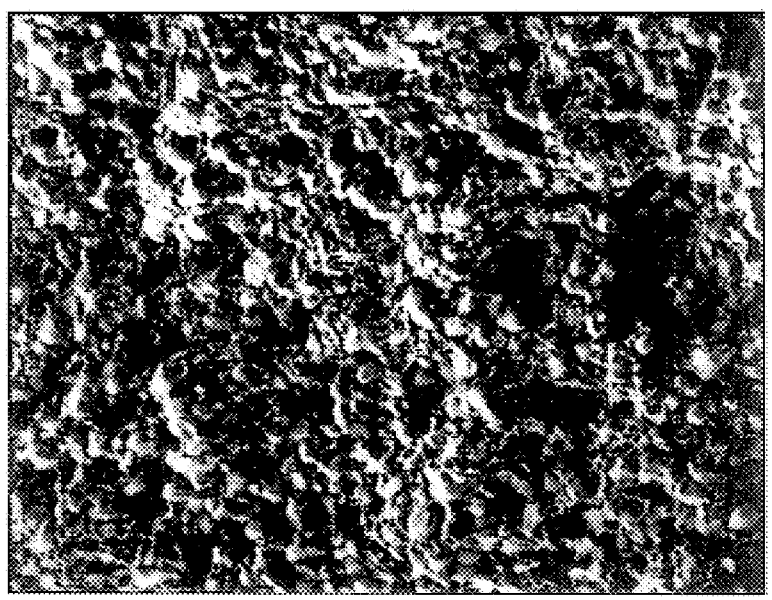

With reference to FIGS. 6, microscope images according to the embodiment of the invention and prior art are shown for comparison. FIG. 6(A) is one obtained by the invention and FIG. 6(B) is one according to the prior art. A sample used is $Al_2O_3$, accelerating voltage applied is 1 kV, and a magnification(magnifying power)is 4000 times. A typical energy range of secondary electrons detected by the embodiment of the invention was approximately 150–180 eV. As clearly shown, example (B) of prior art in which selection of energy ranges was not effected produced a collapsed image as a whole due to charging of a sample, thereby unable to identify irregularities in the surface of the sample. On the other hand, example (A) in which selection of energy ranges was effected produced a clear image indicating irregularities in the surface of the sample clearly.

According to the feature of the embodiment of the invention which has been described above in detail, by changing the voltage to be applied across the pair of electrodes, it become possible to cause secondary electrons to be selectively detected which are at a preferred energy position and with a preferred energy width. If it is arranged such that the operator is allowed to select any particular energy width and its position at discretion by means of an externally provided input device, for example, it becomes possible to selectively detect information that the operator really needs to know.

The scanning electron microscope according to the embodiment of the invention is connected to a display unit which is not indicated. Energy ranges (energy distribution) of secondary electrons indicated in FIG. 3 may be displayed on this display unit, and if it is arranged such that a particular energy width and its position of secondary electrons that are desired to be obtained can be selected using a pointing device or the like on the screen of the display unit, it becomes possible for the operator to selectively detect the secondary electrons on the basis of the information needed or signal quantities. In the scanning electron microscope according to the embodiment of the invention, the voltage to be applied to the deflecting electrodes is controlled according to such selections described above.

Further, the width and position in the energy range may be set numerically using an input device or the like.

According to the feature of the invention, a high efficiency scanning electron microscope can be provided which has an improved efficiency in detection of the secondary electrons without affecting the electron beam for irradiating the sample, and which is suitable for detecting specific secondary electrons in a specified energy range.

What is claimed is:
1. A scanning electron microscope comprising:
an electron gun for generating an electron beam;
a beam irradiation system for condensing and irradiating said electron beam on a specimen;
a secondary electron detector for detecting secondary electrons emitted from said specimen which is irradiated by said electron beam;
a deflection electrode for forming a deflecting field in order to deflect said secondary electrons emitted from said specimen toward said secondary electron detector;
a magnetic field generation unit for forming a magnetic field in a direction orthogonal to the deflecting field formed by said deflecting electrode;
a field generation unit which is connected to said deflecting electrode and has a power supply for applying a variable voltage to a voltage which forms said deflecting field by superimposing thereon;
an electrode which is disposed between said field generation unit and said specimen and has an opening for allowing said electron beam to pass through; and
a control power supply for supplying a negative voltage which is variable to said electrode having the opening.

2. A scanning electron microscope according to claim 1, wherein said field generation unit includes a pair of electrodes arranged with an axis of said electron beam interposed therebetween.

3. A scanning electron microscope according to claim 1, further including a secondary electron attracting electrode for attracting secondary electrons emitted from said specimen toward said field generation unit.

4. A scanning electron microscope according to claim 1, wherein said beam irradiation system includes an object lens, and wherein said field generation unit is disposed on the opposite side of the specimen with respect to said object lens.

5. A scanning electron microscope according to claim 1, further comprising an additional secondary electron detector for detecting secondary electrons passing between said object lens and said specimen, and whereby an image of said specimen is formed by synthesizing all output signals from said secondary electron detector and said additional secondary electron detector.

6. A scanning electron microscope according to claims 1, further comprising an additional secondary electron detector for detecting secondary electrons passing between said object lens and said specimen, and whereby an image of said specimen is formed by synthesizing all output signals from said secondary electron detector and said additional secondary electron detector.

7. A scanning electron microscope according to claim 1, wherein said field generation unit has a surface portion subject to irradiation of said secondary electrons, said surface portion comprising a material which suppresses occurrence of a secondary signal resulting from irradiation of said secondary electrons.

8. A scanning electron microscope comprising:
   an electron gun for generating an electron beam;
   a condenser lens for condensing said electron beam generated by said electron gun;
   a secondary electron detector for detecting electron beams emitted from a specimen which is irradiated by said electron beam which is condensed by said condenser lens, wherein said secondary electron detector comprises:
       a deflecting electrode for deflecting said secondary electrons toward said secondary electron detector;
       an electrode which is disposed between said deflecting electrode and said specimen, and has an opening for allowing said electron beam to pass through;
       at least two power supplies for applying a voltage to said electrode having the opening and/or said deflecting electrode;
       means for setting an energy level of secondary electrons to be detected by said secondary electron detector; and
       means for controlling a voltage to be applied from said at least two power supplies to said deflecting electrode and/or said electrode on the basis of setting by said means for setting the energy level.

9. A scanning electron microscope according to claim 8, further comprising a pair of magnetic poles for forming a magnetic field in a direction which is orthogonal to the direction of said electrical field formed by said deflecting electrode.

10. A scanning electron microscope comprising:
    an electron gun for generating an electron beam;
    a condenser lens for condensing said electron beam generated by said electron gun; and
    a secondary electron detector for detecting electron beams emitted from a specimen which is irradiated by said electron beam which is condensed by said condenser lens, further comprising:
        an electrode for decelerating and/or accelerating said secondary electrons;
        a power supply for applying a voltage to said electrode;
        a display device for displaying a graph indicative of a signal quantity relative to energy of the secondary electrons; and
        means for setting a range of energy for said secondary electrons on said display device, wherein
        a voltage to be applied to said electrode is controlled to be determined on the basis of setting by said means for setting the range of energy.

* * * * *